US012347653B2

(12) United States Patent
Rathi et al.

(10) Patent No.: US 12,347,653 B2
(45) Date of Patent: *Jul. 1, 2025

(54) UNIFORM IN SITU CLEANING AND DEPOSITION

(71) Applicant: Applied Materials, Inc., Santa Clara, CA (US)

(72) Inventors: Saket Rathi, Santa Clara, CA (US); Tuan A. Nguyen, San Jose, CA (US); Amit Bansal, Milpitas, CA (US); Yuxing Zhang, San Jose, CA (US); Badri N. Ramamurthi, Los Gatos, CA (US); Nitin Pathak, Mumbai (IN); Abdul Aziz Khaja, San Jose, CA (US); Sarah Michelle Bobek, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/457,061

(22) Filed: Aug. 28, 2023

(65) Prior Publication Data

US 2023/0402261 A1    Dec. 14, 2023

Related U.S. Application Data

(63) Continuation of application No. 17/213,947, filed on Mar. 26, 2021, now Pat. No. 11,742,185.

(51) Int. Cl.
*H01J 37/32* (2006.01)
*C23C 16/44* (2006.01)
(Continued)

(52) U.S. Cl.
CPC .... *H01J 37/32449* (2013.01); *C23C 16/4405* (2013.01); *C23C 16/45502* (2013.01);
(Continued)

(58) Field of Classification Search
CPC ........... H01J 37/32449; H01J 37/32357; H01J 37/32862; H01J 2237/332; C23C 16/4405;
(Continued)

(56) References Cited

U.S. PATENT DOCUMENTS

| 6,867,146 B2 | 3/2005 | Arita et al. |
| 11,742,185 B2 * | 8/2023 | Rathi ................ H01J 37/32357 118/723 R |

(Continued)

FOREIGN PATENT DOCUMENTS

| CN | 101448977 A | 6/2009 |
| KR | 20100015936 A | 2/2010 |
| WO | 2020/101804 A1 | 5/2020 |

OTHER PUBLICATIONS

U.S. Appl. No. 17/213,947, filed Mar. 26, 2021, Corrected Notice of Allowability mailed Apr. 20, 2023, 2 pages.
(Continued)

*Primary Examiner* — Rudy Zervigon
(74) *Attorney, Agent, or Firm* — Kilpatrick Townsend & Stockton LLP

(57) ABSTRACT

Exemplary semiconductor processing systems may include an output manifold that defines at least one plasma outlet. The systems may include a gasbox disposed beneath the output manifold. The gasbox may include an inlet side facing the output manifold and an outlet side opposite the inlet side. The gasbox may include an inner wall that defines a central fluid lumen. The inner wall may taper outward from the inlet side to the outlet side. The systems may include an annular spacer disposed below the gasbox. An inner diameter of the annular spacer may be greater than a largest inner diameter of the central fluid lumen. The systems may include a faceplate disposed beneath the annular spacer. The
(Continued)

faceplate may define a plurality of apertures extending through a thickness of the faceplate.

19 Claims, 7 Drawing Sheets

(51) Int. Cl.
    *C23C 16/455*     (2006.01)
    *C23C 16/50*     (2006.01)

(52) U.S. Cl.
    CPC ........ *C23C 16/45591* (2013.01); *C23C 16/50* (2013.01); *H01J 37/32357* (2013.01); *H01J 37/32862* (2013.01); *H01J 2237/332* (2013.01)

(58) Field of Classification Search
    CPC ........ C23C 16/45502; C23C 16/45591; C23C 16/50; C23C 16/452; C23C 16/45565
    USPC .............. 118/715; 156/345.33, 345.34
    See application file for complete search history.

(56) References Cited

U.S. PATENT DOCUMENTS

| | | |
|---|---|---|
| 2010/0180819 A1 | 7/2010 | Hatanaka et al. |
| 2012/0312234 A1 | 12/2012 | Nasman et al. |
| 2015/0376784 A1* | 12/2015 | Wu ................... C23C 16/45544 118/733 |
| 2016/0083837 A1 | 3/2016 | Narushima et al. |
| 2016/0086772 A1 | 3/2016 | Khaja et al. |
| 2016/0312360 A1 | 10/2016 | Rasheed et al. |
| 2017/0067157 A1* | 3/2017 | Ashihara ................. C23C 14/50 |
| 2017/0236691 A1 | 8/2017 | Liang et al. |
| 2018/0337057 A1 | 11/2018 | Samir et al. |
| 2019/0252216 A1 | 8/2019 | Samir et al. |
| 2020/0381295 A1* | 12/2020 | Cui ..................... C23C 16/4584 |

OTHER PUBLICATIONS

U.S. Appl. No. 17/213,947, filed Mar. 26, 2021, Notice of Allowance mailed Apr. 13, 2023, 9 pages.
U.S. Appl. No. 17/213,947, filed Mar. 26, 2021, Non-Final Office Action mailed Dec. 8, 2022, 10 pages.
International Search Report and Written Opinion for PCT/US2022/020863 mailed Jul. 8, 2022, 11 pages.
International Preliminary Report on Patentability for PCT/US2022/020863 issued Sep. 12, 2023, 7 pages.
Notice of Decision to Grant for TW111110505 dated May 1, 2023, 2 pages.
Office Action for TW111110505 dated Dec. 8, 2022, 7 pages.
Notice of Decision to Grant for TW112128733 dated Feb. 1, 2024, 5 pages.
Office Action for TW112128733 dated Oct. 27, 2023, 7 pages.
KR10-2023-7036248, "Office Action", Feb. 4, 2025, 16 pages.

* cited by examiner

UNIFORM IN SITU CLEANING AND DEPOSITION

CROSS-REFERENCE TO RELATED APPLICATIONS

This application is a continuation of U.S. application Ser. No. 17/213,947, filed Mar. 26, 2021, which is hereby incorporated by reference in its entirety for all purposes.

TECHNICAL FIELD

The present technology relates to components and apparatuses for semiconductor manufacturing. More specifically, the present technology relates to processing chamber distribution components and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Chamber components often deliver processing gases and plasma to a substrate for depositing films or removing materials. To promote symmetry and uniformity during the deposition cycle, many chamber components may include regular patterns of features, such as apertures, for providing materials in a way that may increase uniformity, but the same features create hindrance during the cleaning/material removal cycle via plasma. This may limit the ability to tune recipes for on-wafer adjustments and limit throughput of the system as a whole.

Thus, there is a need for improved systems and methods that can be used to produce high quality devices and structures. These and other needs are addressed by the present technology.

BRIEF SUMMARY OF THE INVENTION

Exemplary semiconductor processing systems may include an output manifold that defines at least one plasma outlet. The systems may include a gasbox disposed beneath the output manifold. The gasbox may include an inlet side facing the output manifold and an outlet side opposite the inlet side. The gasbox may include an inner wall that defines a central fluid lumen. The inner wall may taper outward from the inlet side to the outlet side. The systems may include an annular spacer disposed below the gasbox. An inner diameter of the annular spacer may be greater than a largest inner diameter of the central fluid lumen. The systems may include a faceplate disposed beneath the annular spacer. The faceplate may define a plurality of apertures extending through a thickness of the faceplate.

In some embodiments, the at least one plasma outlet may be disposed radially outward of a top of the central fluid lumen. The inlet side of the gasbox may define a recess that is fluidly coupled with the at least one plasma outlet. A bottom of the recess may define a ledge that extends to an outer edge of the top of the central fluid lumen. The output manifold may define a recursive flow path that fluidly couples one or more gas inlets with the at least one plasma outlet. A number of the at least one plasma outlet may be greater than a number of the one or more gas inlets. The systems may include a tapered insert disposed within the annular spacer. The tapered insert may taper outward from the outlet side of the gasbox to a radial position that is beyond the plurality of apertures. The systems may include a spacer disposed between the output manifold and the gasbox. The spacer may define at least one inlet that is fluidly coupled with the at least one plasma outlet. An inner wall of the spacer may define a tapered lumen that is fluidly coupled between the at least one inlet and the central fluid lumen of the gasbox. The tapered lumen may taper outward in a direction of the inlet side of the gasbox. The spacer may define a plurality of channels that extend between the at least one inlet and the tapered lumen that expand a flow path from the at least one inlet into a greater number of fluid paths. The at least one inlet may include an annular channel. The plurality of channels may include radially arranged channels that extend inward from the annular channel to the tapered channel. A taper of the tapered lumen may match the taper of the central fluid lumen at an interface of the spacer and the gasbox. An inner diameter of the annular spacer may be positioned radially outward of the plurality of apertures. The systems may include a remote plasma source that defines an outlet. The outlet may be fluidly coupled with an inlet of the output manifold.

Some embodiments of the present technology may encompass semiconductor processing systems. The semiconductor processing systems may include a remote plasma source defining at least one outlet. The semiconductor processing systems may include an output manifold that defines at least one plasma inlet and at least one plasma outlet. The at least one plasma inlet may be fluidly coupled with the at least one outlet of the remote plasma source. The semiconductor processing systems may include a gasbox disposed beneath the output manifold. The gasbox may include an inlet side facing the output manifold and an outlet side opposite the inlet side. The gasbox may include an inner wall that defines a central fluid lumen. The inner wall may taper outward from the inlet side to the outlet side. The semiconductor processing systems may include a faceplate disposed beneath the gasbox. The faceplate may define a plurality of apertures extending through a thickness of the faceplate.

In some embodiments, a degree of taper of the inner wall of the central fluid lumen may be constant along a length of the central fluid lumen. A degree of taper of the inner wall of the central fluid lumen may vary along a length of the central fluid lumen. The systems may include a spacer disposed between the output manifold and the gasbox. The spacer may define at least one inlet that is fluidly coupled with the at least one plasma outlet. An inner wall of the spacer may define a tapered lumen that is fluidly coupled between the at least one inlet and the central fluid lumen of the gasbox. The spacer may define a plurality of channels that extend between the at least one inlet and the tapered lumen. The output manifold may define a recursive flow path that fluidly couples the at least one plasma inlet with the at least one plasma outlet.

Some embodiments of the present technology may encompass methods of distributing a gas to a faceplate. The methods may include flowing one or both of the gas and the plasma into a central fluid lumen of a gasbox from at least one outlet of an output manifold. The central fluid lumen may be defined by an inner wall of the gasbox that tapers outward from an inlet side of the gasbox to an outlet side of the gasbox. The methods may include flowing the one or both of the gas and the plasma through a plurality of apertures defined within a faceplate disposed beneath the gasbox.

In some embodiments, flowing the one or both of the gas and the plasma into the central fluid lumen of the gasbox may include splitting the flow of the one or both of the gas and the plasma from the at least one outlet into a greater number of fluid channels within a spacer that is disposed between the output manifold and the gasbox. The methods may include flowing the one or both of the gas and the plasma from a remote plasma source to an inlet of the output manifold. The methods may include flowing the gas through a recursive flow path that extends between the inlet and the at least one outlet of the output manifold. The at least one plasma outlet may be disposed radially outward of a top of the central fluid lumen.

Such technology may provide numerous benefits over conventional systems and techniques. For example, embodiments of the present technology may provide more uniform film deposition and better cleaning of chamber components such as the faceplate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
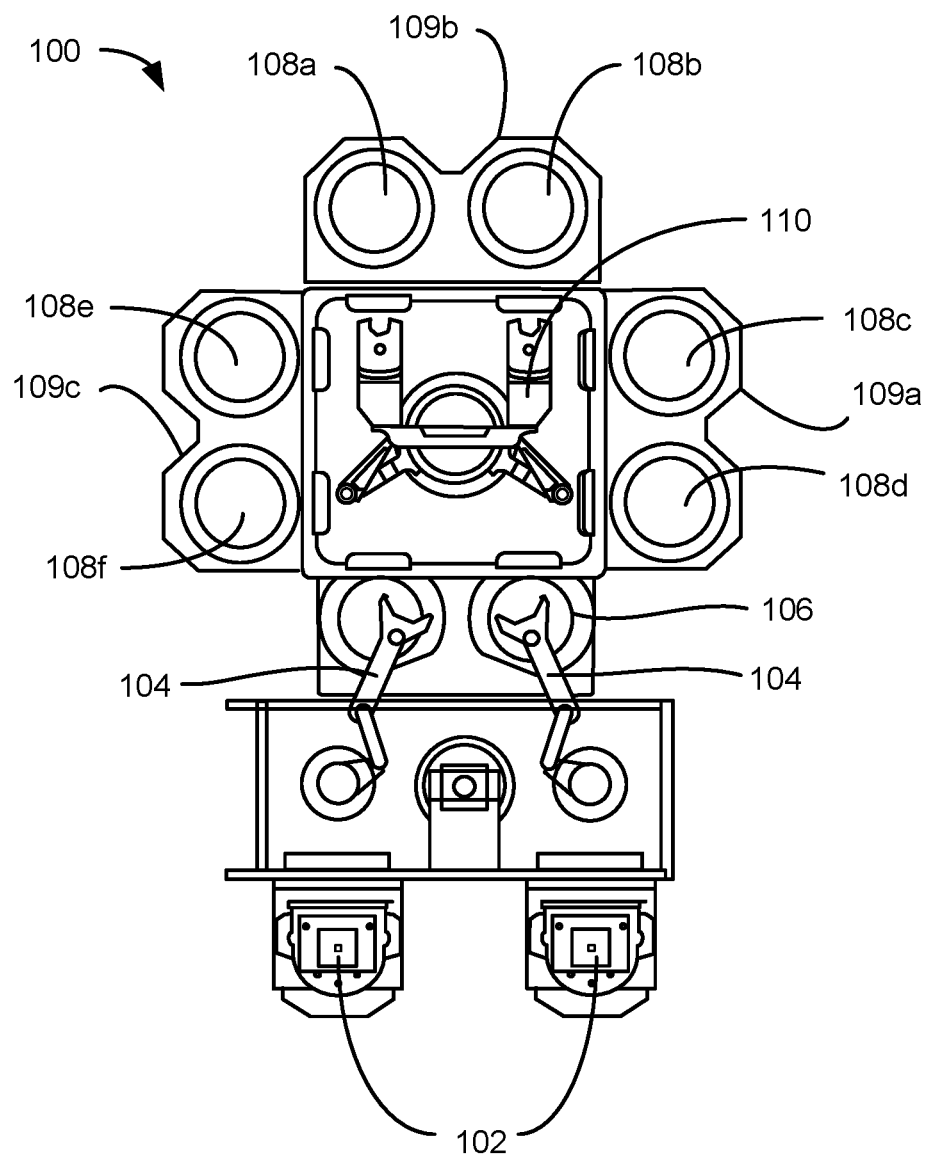
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral distribution of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. For example, one or more devices may be included within a processing chamber for delivering and distributing precursors within a processing chamber. A blocker plate may be included in a chamber to provide a choke in precursor flow, which may increase residence time at the blocker plate and lateral or radial distribution of precursors. A faceplate may further improve uniformity of delivery into a processing region, which may improve deposition or etching.

The various chamber components may be cleaned after some or all processing steps to remove any residue and/or other deposition that may be present on the components. This may be particularly important after processes that involve conductive materials, such as carbon. For example, as any conductive residue present one components such as the faceplate may create a conductive path that causes arcing during subsequent processing operations and creates a source for secondary fall-on particles on wafer from faceplate residue. To maintain high wafer throughput and low particle generation, conventional chambers may utilize a cleaning operations that only involve the introduction of cleaning gases from a remote plasma source (RPS) unit. However, blocker plates used in conventional chambers prevent gas/plasma flow from RPS units from reaching the peripheral edges of the faceplate, heater edges, and/or the pumping liner, leading to residue formation at these locations. These problems cannot be overcome simply by removing the blocker plate, as this may result in a non-uniform distribution of process gases, which may lead to film uniformity issues and will still leave some surfaces under-cleaned. In particular, merely removing the blocker plate from a conventional chamber design may result in wafers having areas of thin film deposition near a center of the wafer and residue on the pumping liner, heater/pedestal edge, and/or edges of the faceplate.

The present technology overcomes these challenges by using one or more chamber components that create an expansion volume that begins well above the faceplate to enable precursors, plasma effluents, and/or other gases adequate space to more uniformly expand across the entire surface area of the faceplate and more. In particular, embodiments may include chamber designs that do not include a blocker plate, while providing a gas box and/or spacer that defines a tapering expansion volume to better distribute gases to the faceplate. This may not only help enhance film uniformity on wafer, but may also better distribute cleaning gases/plasma to peripheral regions of the faceplate to remove any deposition or other residue on the faceplate. The improved faceplate cleaning may therefore help prevent arcing and secondary fall-on defects that may otherwise occur during wafer processes that utilize conductive deposition materials.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
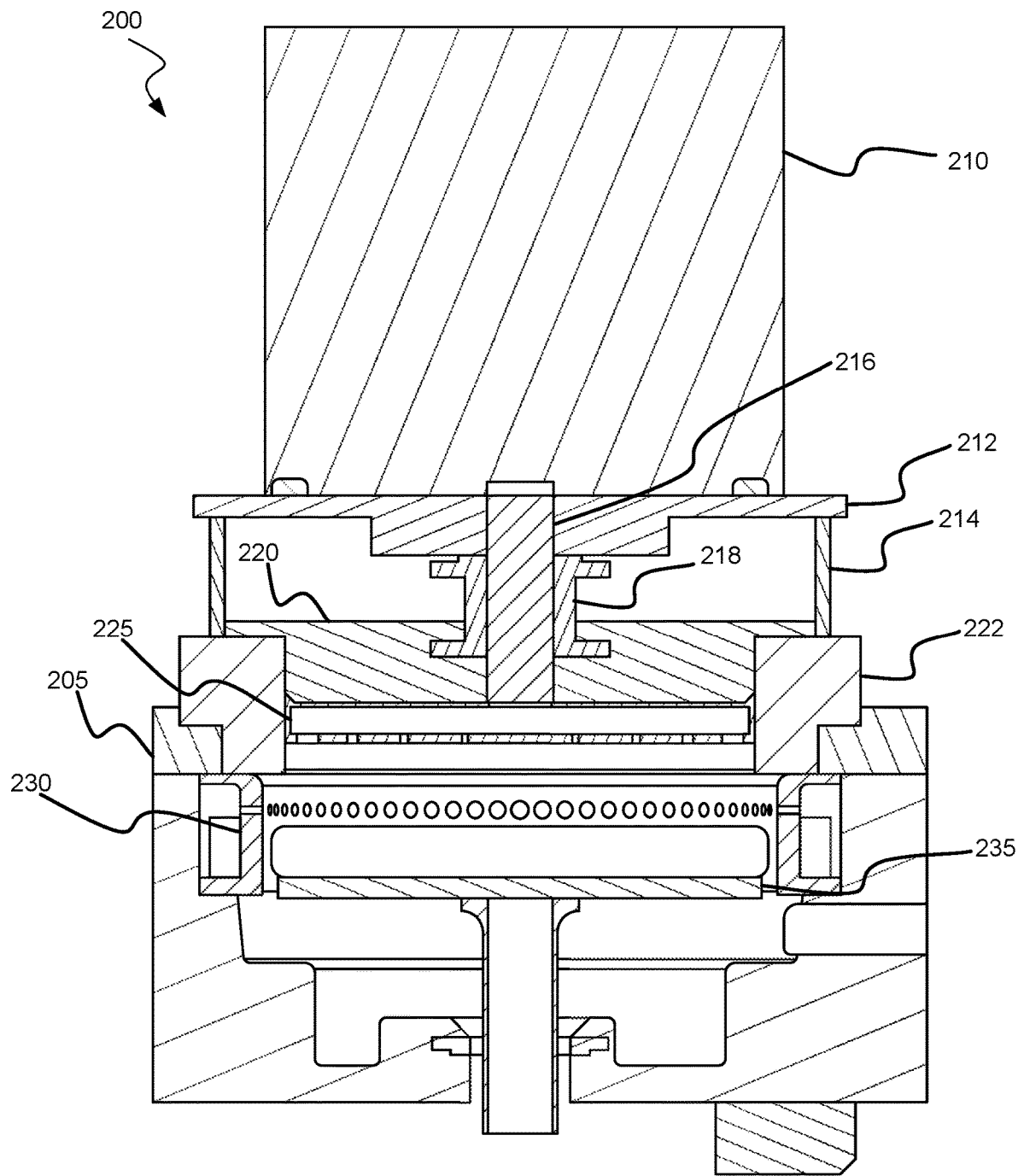
FIG. 2 shows a schematic cross-sectional view of an exemplary processing system according to some embodiments of the present technology.

FIG. 2 shows a schematic cross-sectional view of an exemplary processing system 200 according to embodiments of the present technology. The system may include a processing chamber 205, and a remote plasma source ("RPS") unit 210. The RPS unit 210 may be stabilized on a platform 212 having support members 214 that may couple with the processing chamber 205 at one or more positions about the processing chamber 205. By utilizing additional support members 214 along with platform 212, the weight of the RPS unit 210 may be properly distributed to protect components from sheer or other stresses related to the weight of the RPS unit 210. A delivery tube 216 may be coupled between or with the RPS unit 210 and the processing chamber 205 for delivering one or more precursors to the processing chamber 205. A flange adaptor 218 may be positioned about the delivery tube 216 in order to provide additional stability and support against the RPS unit 210, which may otherwise damage the delivery tube 216 from the support weight. The flange adaptor 218 may contact the platform 212 to provide support for the RPS unit 210, additionally so that the weight of the RPS unit 210 is not borne on the delivery tube 216.

The processing chamber 205 may include a gas box 220 providing access to the processing chamber 205. The gas box 220 may define an access to the processing chamber 205, and in embodiments, the access may be centrally defined or located within the gas box 220. The delivery tube 216 may be positioned or coupled within the access of the gas box 220 providing a precursor path between the RPS unit 210 and the interior of the processing chamber 205. The flange adaptor 218 may also contact the top plate 212 to distribute at least a portion of the weight of the RPS unit 210, to prevent or reduce stress on the delivery tube 216.

In embodiments a spacer 222 may at least partially define the processing chamber 205 exterior and interior walls. A gas distribution assembly 225 may be positioned within the processing chamber 205 proximate the delivery tube 216, and the gas distribution assembly 225 may allow distribution of precursors or plasma effluents into the processing chamber 205. A pumping liner 230 may be positioned within a processing region of the processing chamber 205. The pumping liner 230 may allow unreacted precursors or plasma effluents to be exhausted from the processing chamber 205. The pumping liner 230 may additionally allow particles etched in an etching process to be removed from the processing chamber 205 to prevent the particles from remaining on the substrate during subsequent processing operations.

A pedestal 235 may be included in the processing region of the processing chamber 205 and may be configured to support a substrate during etching or other process operations. The pedestal 235 may have one or more chucking mechanisms in various embodiments including electrostatic, vacuum, or gravitational, for example. The pedestal 235 may be rotatable or translatable in embodiments, and may be raised towards or lowered from the gas distribution assembly 225. In embodiments the pedestal 235 may include one or more lift pins for aiding transfer of a substrate into and out of the processing chamber 205. Pedestal 235 may additionally include heating or cooling mechanisms for maintaining substrate temperatures during processing operations.

The pedestal 235 may include an inlaid heating element including a filament, or may include one or more tubes or channels configured to pass a temperature controlled fluid that may raise or lower the temperature accordingly. Pedestal 235 may include a platform for supporting a substrate that is or includes a ceramic heater. The ceramic heater may heat the substrate to particular operating temperatures including from about 20° C. to over 1000° C. in embodiments. The ceramic heater may additionally heat the substrate above about 50° C., above about 100° C., above about 150° C., above about 200° C., above about 250° C., above about 300° C., above about 350° C., above about 400° C., above about 500° C., or higher in embodiments. The ceramic heater may additionally maintain the substrate temperature below about 1000° C., below about 900° C., below about 800° C., below about 700° C., below about 600° C., or below about 500° C. in embodiments. The ceramic heater may additionally be configured to heat or maintain the substrate temperature between about 100° C. and about 500° C. in embodiments, or between about 300° C. and about 500° C. in embodiments. In embodiments the heater is configured to maintain the substrate temperature below about 300° C., in which case alternative metal heating elements may be used instead of a ceramic heater. For example, a coated aluminum heater may be used, or an embedded or coated heater on an aluminum or treated aluminum pedestal.

The components of processing chamber 205 may be configured to withstand the operating environment during etching or other processing operations. The components of processing chamber 205 may be an anodized or oxidized material, including hard anodized aluminum, for example. Each component within processing chamber 205 that may be contacted by plasma effluents or other corrosive materials may be treated or coated to protect against corrosion. Alternative materials may also be utilized to protect against corrosion from plasma effluents including fluorine or chlorine in embodiments. For example, one or more components within processing chamber 205 may be ceramic or quartz in embodiments. As a particular example, one or more components of gas distribution assembly 225, spacer 222, pumping liner 230, or any component that may be contacted by plasma or non-plasma precursors may be or include quartz or ceramic. Additionally, delivery tube 216 may be or include quartz, such as including a quartz liner within the delivery tube 216. The delivery tube may be aluminum or hard anodized aluminum in embodiments, and may be characterized by a quartz interior surface. RPS unit 210 may also be lined with quartz in order to protect the internal components from corrosion caused by precursors dissociated within the RPS unit 210 including or chlorine, for example. The RPS unit 210 may include anodized metals, and the RPS unit 210 chamber cavities may be lined with quartz to further protect against corrosion.

By utilizing a remote plasma from RPS unit 210, the processing chamber 205 may be further protected against internal corrosion caused by plasma generation. In embodiments, processing chamber 205 may not be configured to produce a plasma, and plasma generation may be performed externally to the processing chamber 205 in RPS unit 210. In embodiments additional plasma processing may be performed within processing chamber 205, such as by a capacitively-coupled plasma, although other plasma sources may be used. For example, gas box 220 and one or more components of the gas distribution assembly 225 may be utilized as electrodes by which a capacitively-coupled plasma may be produced. Additional or alternative plasma components within the chamber may be used to assist with recombination of plasma effluents by reducing the path length from plasma generation to interaction with a substrate.

Precursors dissociated by plasma will recombine after a certain residence time. For example, after a chlorine-based precursor is dissociated within RPS unit 210, the precursor or plasma effluents may be flowed through delivery tube 216 into processing chamber 205, and then interact with a substrate on pedestal 235. Depending on the length of the path of travel for the radical effluents, the effluents or radicals may recombine and at least partially lose the reactivity of the radical precursor. Additionally, the more complicated the path of travel, such as through various tubes or channels, the more protection may be included in the system as each component in contact with the plasma effluents may be treated or coated to protect from corrosion. Accordingly, processing chamber 205 may include a relatively straight line of travel from RPS unit 210 into processing chamber 205, and then through exhaust plenum 230. Additionally, once within processing chamber 205, precursors or plasma effluents may travel through one or more inline aspects of the gas distribution assembly 225 to contact a substrate. Components of the gas distribution assembly 225 may be utilized to improve uniformity of flow towards a substrate, but otherwise maintain a reduced length of precursor flow path to reduce recombination of the plasma effluents as well as residence time within the processing chamber 205.

Figure 3:
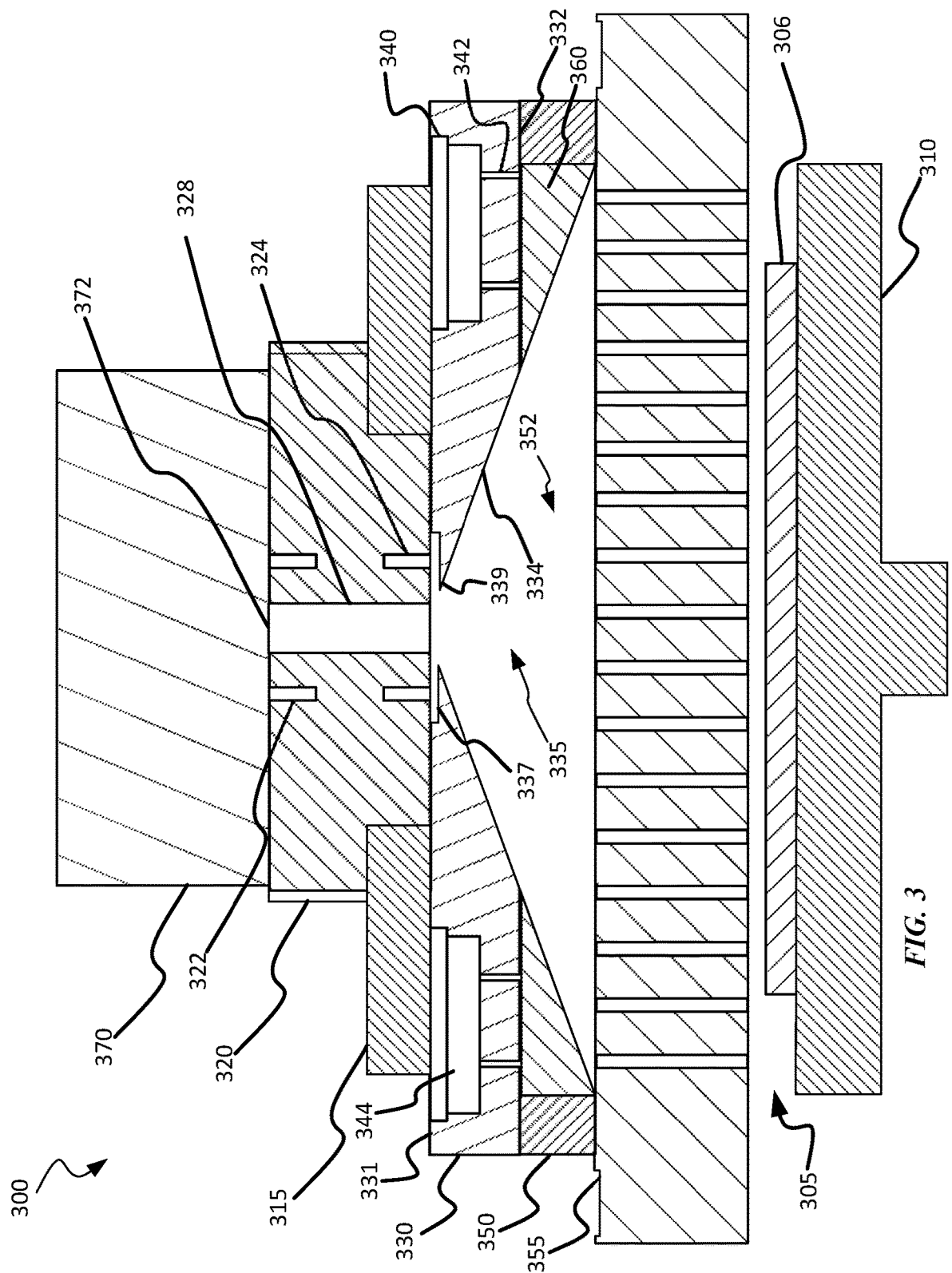
FIG. 3 shows a schematic partial cross-sectional view of an exemplary semiconductor processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of hardmask materials as previously described, as well as other deposition, removal, and cleaning operations. Chamber 300 may show a partial view of a processing region of a semiconductor processing system, and may not include all of the components, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber 300 into a processing region 305, such as where a substrate 306 may be positioned on a pedestal 310, for example. A chamber lid plate 315 may extend across one or more plates of the lid stack and may provide structural support for components, such as a remote plasma source ("RPS") unit 370, which may provide precursors or plasma effluents for chamber cleaning or other processing operations. The RPS unit 370 may be stabilized on the chamber lid plate 315. Some embodiments may utilize additional support members (not shown) that may couple with the processing chamber 300 at one or more positions about the processing chamber 300 to properly distribute the weight of the RPS unit 370 to protect components from sheer or other stresses related to the weight of the RPS unit 370. The RPS unit 370 may include at least one outlet 372 by which precursors or plasma effluents may be delivered to the chamber 300.

An output manifold 320 may be seated on and/or within the lid plate 315. For example, the output manifold 320 may include a flange that sits atop the lid plate 315 and a central body portion that extends partially into an aperture formed in the lid plate 315. The output manifold 320 may define one or more gas inlets 322 that are fluidly coupled with an outlet of the RPS unit 370. The output manifold 320 may include one or more gas outlets 324 that are fluidly coupled with the gas inlets 322. For example, the output manifold 320 may define a recursive flow path that fluidly couples the gas inlets 322 with the gas outlets 324. The recursive flow path may be formed from a number of channels that divide gas flow from the gas inlets 322 into a greater number of gas outlets 324. As just one example, one gas inlet 322 may be divided into four gas outlets 324 by the recursive flow path. The output manifold 320 may define a central aperture 328 that may be fluidly coupled with the outlet 372 of the RPS unit 370. Central aperture 328 may serve as both an inlet and an outlet of the output manifold 320.

Processing chamber 300 may also include a gasbox 330 that is positioned beneath the output manifold 320. Gasbox 330 may be characterized by a first surface 331 on an inlet side and a second surface 332 on an outlet side that may be opposite the first surface. Gasbox 330 may include an inner wall 334 that defines a central fluid lumen 335. All or a portion of the inner wall 334 may taper outward from the inlet side to the outlet side such that the central fluid lumen 335 provides an expansion volume for gases flowing from the RPS unit 370 and/or output manifold 320. The taper of the inner wall 334 may be constant along all of the length of the inner wall 334 such that the central fluid lumen 335 has a generally conical frustum shape. For example, a degree of taper of the inner wall 334 relative to vertical may be greater than or about 45°, greater than or about 50°, greater than or about 55°, greater than or about 60°, greater than or about 65°, greater than or about 70°, greater than or about 75°, greater than or about 80°, or more. The taper of the inner wall 334 may be constant along only a portion of the wall. For example, the inner wall 334 may include two or more sections having a different degrees of taper. As just one example, a top section of the inner wall 334 may have a steeper degree of taper relative to vertical, while a lower section of the inner wall 334 may have a lesser degree of taper. For example, the top section of the inner wall 334 may have a degree of taper relative to vertical of less than or about 70°, less than or about 65°, less than or about 60°, greater than or about 55°, or less. The lower section of the inner wall 334 may have a degree of taper relative to vertical of greater than or about 55°, greater than or about 60°, greater than or about 65°, greater than or about 70°, greater than or about 75°, greater than or about 80°, or more. The inner wall 334 may taper linearly outward and/or may taper outward in a curved manner.

The central fluid lumen 335 may be fluidly coupled with the central aperture 328 such that cleaning plasma and/or process gases flowing from the outlet 372 of the RPS unit 370 may be delivered to the central fluid lumen 335 via the central aperture 328. A top of the central fluid lumen 335 may be positioned radially inward of the gas outlets 324 of the output manifold 320. A recess 337 may be formed in the first surface 331 of the gasbox 330 that may extend between and fluidly couple the gas outlets 324 with the central fluid lumen 335. The recess 337 and/or a channel in fluid communication with the recess 337 may extend radially inward from the plasma outlet 324 to a top of the central fluid lumen 335. A base of the recess 337 may define a ledge 339 that helps choke the gas flow from the gas outlets 324 and that directs the gas flow laterally inward to the top of the central fluid lumen 335, which may help more uniformly distribute the gases within the central fluid lumen 335. The gas may expand outward as the gas flows downward through the expansion volume provided by central fluid lumen 335.

Gasbox 330 may also define one or more channels that may be fluidly accessed through the gasbox 330, and may allow multiple precursors to be delivered through the lid stack in a variety of flow profiles. For example, gasbox 330 may define an annular channel 340 extending within the gasbox 330, and which may be recessed from first surface 331. As will be explained further below, annular channel 340 may be fluidly accessed through an inlet aperture, which may be positioned at any location about the gasbox 330, and may afford coupling for one or more precursors to be delivered from a gas panel or manifold. The inlet aperture may extend through first surface 331, for providing precursors into the gasbox 330. In some embodiments, annular channel 340 may be concentric with the central fluid lumen 335 of the gasbox 330. Gasbox 330 may also define one or more outlet apertures 342. Outlet apertures 342 may be defined through the annular channel 340, and may extend from annular channel 340 through second surface 332 of the gasbox 330. Hence, one or more precursors delivered into annular channel 340 through the gasbox 330 may bypass the RPS unit 370 and be delivered to one or more outer regions of the gasbox 330.

Gasbox 330 may include additional features. For example, gasbox 330 may define a cooling channel 344, which may allow a cooling fluid to be flowed about the gasbox 330, and which may allow additional temperature control. As illustrated, the cooling channel 344 may be defined in the first surface 331 of the gasbox 330, and a lid may extend about the cooling channel to form a hermetic seal. Cooling channel 344 may extend about central fluid lumen 335, and may also be concentric with the central fluid lumen 335. As illustrated, annular channel 340 may be formed or defined within the gasbox 330 between the cooling channel 344 and the second surface of the gasbox 330. In some embodiments the annular channel 340 may be vertically aligned with the cooling channel 344, and may be offset from the cooling channel 344 within a depth of the gasbox 330. To form the annular channel 340, in some embodiments the gasbox 330 may include one or more stacked plates. The plates may be bonded, welded, or otherwise coupled together to form a complete structure.

For example, gasbox 330 may include at least one plate, and may include two, three, four, or more plates depending on the features formed. As illustrated, gasbox 330 may include two or three plates, which may allow multiple paths to be formed to further distribute precursors towards the annular channel 340. For example, with a single point of delivery, uniformity may be achieved by modulating conductance within the channel relative to the outlet apertures. However, by utilizing one or more conductance paths defined within the gasbox 330, precursors may be delivered to multiple locations within the annular channel 340, which may increase uniformity of delivery through the gasbox 330, and may allow larger diameter outlet apertures without sacrificing delivery uniformity.

Semiconductor processing chamber 300 may also include additional components in some embodiments, such as an annular spacer 350 and a faceplate 355. Faceplate 355 may define a number of apertures that extend through a thickness of the faceplate 355 that enable precursors and/or plasma effluents to be delivered to the processing region 305, which may be at least partially defined from above by the faceplate 355. An inner diameter of the annular spacer 350 may be positioned radially outward of the apertures of the faceplate 355 so as to not obstruct the flow of gas through the faceplate 355. The annular spacer 350 may define a volume 352 that is fluidly coupled with the central fluid lumen 335. The volume 352 may be a first location through the lid stack where precursors delivered to the central fluid lumen 335 of the gasbox 330 and precursors delivered to the annular channel 340 of the gasbox 330 may intermix. Volume 352 may be fluidly accessible from both central fluid lumen 335 and the outlet apertures 342. Precursors delivered into the volume 352 may then at least partially mix or overlap before continuing through the lid stack. By allowing an amount of mixing prior to contacting the substrate surface, an amount of overlap may be provided, which may produce a smoother transition at the substrate, and may limit an interface from forming on a film or substrate surface.

An inner wall of the annular spacer 350 may be positioned radially outward from a bottom end of the central fluid lumen 335. This may result in a stepped transition between a bottom end of the central fluid lumen 335 and the volume 352 that allows gas flow to expand to a full exposed area of the faceplate 355 upon passing into the volume 352. For example, the volume 352 may have a generally rectangular cross-section such that gas introduced to the central fluid lumen 335 is initially constrained by a frustum-shaped inner wall 334 before expanding to volume 352 that in constrained by an inner wall of the annular spacer 350 that has a larger diameter than a bottom of the inner wall 334 of the gasbox 330.

The chamber 300 may include a tapered insert 360 that is positioned within volume 352 defined by the inner wall of the annular spacer 350. For example, the tapered insert 360 may be sized and shaped to be received within the annular spacer 350 and to abut the inner wall of the annular spacer 350. The tapered insert 360 may include an inner wall that tapers outward from the outlet side of the gasbox 330 to a radial position that is outward of the apertures of the faceplate 355. A top edge of the inner wall of the tapered insert 360 may be aligned with a bottom edge of the inner wall 334 of the gasbox 330 such that an expansion volume defined by the central fluid lumen 335 and the volume 352 is generally continuous and uninterrupted. A degree of taper of the inner wall of the tapered insert 360 may match a degree of taper of the inner wall 334 of the gasbox 330 in some embodiments, while in other embodiments a degree of taper of the inner walls may be different. Tapered insert 360 and annular spacer 350 may be separate components or may be a single unit in various embodiments.

By providing a tapered expansion volume within and/or below the gasbox 330, better RPS-only cleaning uniformity and wider reach may be achieved. In particular, providing an expansion volume further from the faceplate 355 provides more space and distance for precursors and plasma effluents to expand radially outward to more effectively distribute cleaning gases to the outer periphery of the faceplate 355 and other chamber components, such as the edge of the pedestal 310 and/or pumping liner. The increased distribution of the cleaning gases to the outer periphery of the faceplate may also help prevent arcing from occurring during certain deposition procedures, such as those that utilize conductive elements such as carbon. Additionally, such a gasbox design may help more evenly distribute deposition gases through the faceplate 355 to generate a more uniform film on wafer.

Figure 4:
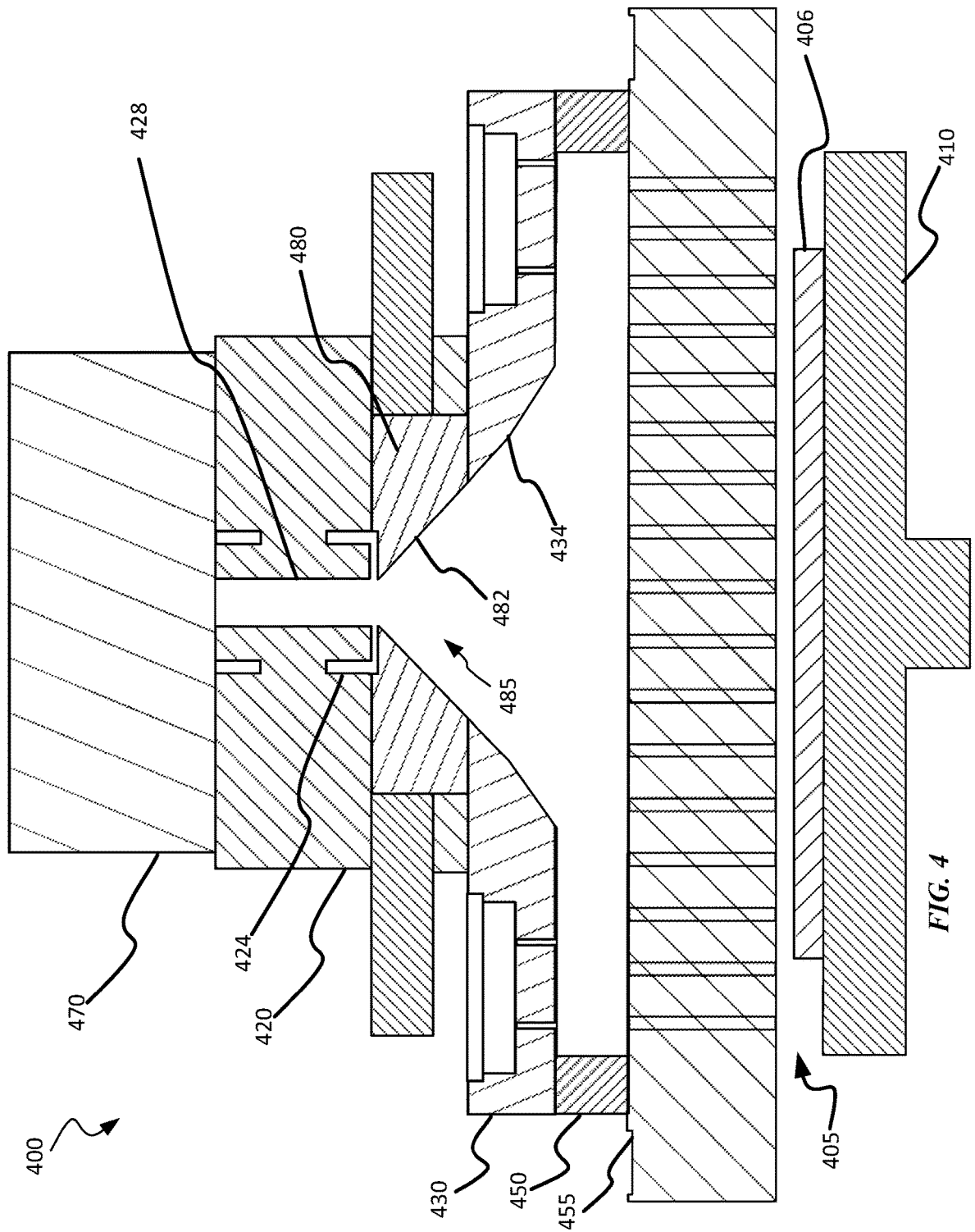
FIG. 4 shows a schematic cross-sectional view of an exemplary semiconductor processing chamber according to some embodiments of the present technology.

FIG. 4 shows a schematic partial cross-sectional view of an exemplary semiconductor processing chamber 400 according to some embodiments of the present technology. FIG. 4 may include one or more components discussed above with regard to FIGS. 2 and 3, and may illustrate further details relating to that chamber. Chamber 400 is understood to include any feature or aspect of system 200 and/or chamber 300 discussed previously. Chamber 400 may show a partial view of a processing region of a semiconductor processing system, and may not include all of the components, and which are understood to be incorporated in some embodiments of chamber 400. Chamber 400 may include a processing region 405, such as where a substrate 406 may be positioned on a pedestal 410, a RPS unit 470, and an output manifold 420. Semiconductor processing chamber 400 may also include additional components in some embodiments, such as an annular spacer 450 and a faceplate 455. In some embodiments, the chamber 400 may include a tapered insert similar to tapered insert 360 described above.

Figure 5:
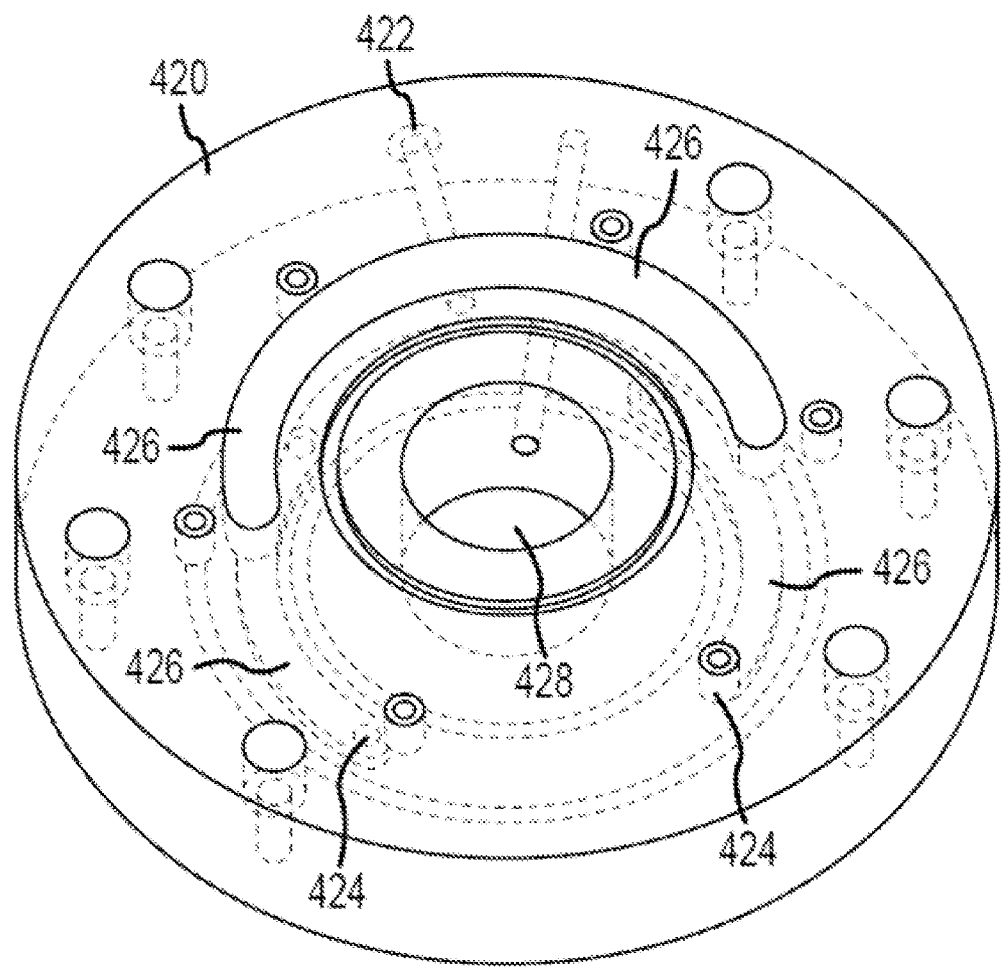
FIG. 5 shows a schematic isometric view of an output manifold according to some embodiments of the present technology.

FIG. 5 shows a schematic isometric view of the output manifold 420. The output manifold 420 may define one or more gas inlets 422 that are fluidly coupled with an outlet 472 of the RPS unit 470. The output manifold 420 may include one or more gas outlets 424 that are fluidly coupled with the gas inlets 422. For example, the output manifold 420 may define a recursive flow path that fluidly couples the gas inlets 422 with the gas outlets 424. The recursive flow path may be formed from a number of channels 426 that divide gas flow from the gas inlets 422 into a greater number of gas outlets 424. As illustrated, a single plasma inlet 422 is defined within a lateral side of the output manifold 420. The plasma inlet 422 is fluidly coupled with a channel 426 that divides the incoming gas flow into two branches. Each of the two branches has an outlet that directs gas to two additional channels 426, which further divide each branch in two. In this manner flow from the single plasma inlet 422 may be divided into four gas outlets 424 by the channels 426 that define the recursive flow path. The output manifold 420 may define a central aperture 428 that may be fluidly coupled with an outlet of the RPS unit 470. Central aperture 428 may serve as both an inlet and an outlet of the output manifold 420.

As illustrated in FIG. 4, processing chamber 400 may also include a gasbox 430 that is positioned beneath the output manifold 420. Gasbox 430 may be characterized by a first surface 431 on an inlet side and a second surface 332 on an outlet side that may be opposite the first surface. Gasbox 430 may include an inner wall 434 that defines a central fluid lumen 435. All or a portion of the inner wall 434 may taper outward from the inlet side to the outlet side such that the central fluid lumen 435 defined by inner wall 434 provides an expansion volume for gases flowing from the RPS unit 470 and/or output manifold 420. As illustrated, the inner wall 434 includes two sections having different degrees of taper. For example, as shown a top section of the inner wall 434 has a steeper degree of taper than a lower section of the inner wall 434. It will be appreciated that more than two sections of the inner wall 434 may have different degrees of taper and that the relative position of steeper and/or flatter degrees of taper may be arranged in any order. The taper of the inner wall 434 may be constant along all or a portion of the length of the inner wall 434 in various embodiments. The inner wall 434 may taper linearly outward and/or may taper outward in a curved manner.

Processing chamber 400 may include a spacer 480 that is disposed between the output manifold 420 and the gasbox 430. For example, the spacer 480 may be seated atop the gasbox 430. Spacer 480 may distribute gas flow from the output manifold 420 into the gasbox 430. For example, the spacer 480 may include an inner wall 482 that defines a tapered lumen 485 through which gases from the output manifold 420 may flow into the gasbox 430. The tapered lumen 485 may be disposed within a center of the spacer 480 and may be aligned with the central fluid lumen 435 of the gasbox 430. All or a portion of the inner wall 482 may taper outward from the manifold side to the gasbox side such that the tapered lumen 485 serves a starting point of the expansion volume for gases flowing from the RPS unit 470 and/or output manifold 420. The taper of the inner wall 482 may be constant along all of the length of the inner wall 482 such that the tapered lumen 485 has a generally conical frustum shape. The taper of the inner wall 482 may be constant along all or a portion of the wall. The inner wall 482 may taper linearly outward and/or may taper outward in a curved manner. A bottom end of the inner wall 482 may have diameter that at least substantially matches a diameter of a top end of the inner wall 434, which may enable the expansion volume provided within the tapered inner walls of the spacer 480 and gasbox 430 to be continuous. In some embodiments, the degree of taper of the inner wall 482 of the spacer 480 may match a degree of taper of the inner wall 434 of the gasbox 430, while in other embodiments the degrees of taper may be different. For example, all or part of the inner wall 482 may be tapered in a steeper manner than all or part of the inner wall 434, which may provide for more rapid radial expansion of gases flowing downward through the spacer 480 and gasbox 430.

Figure 6:
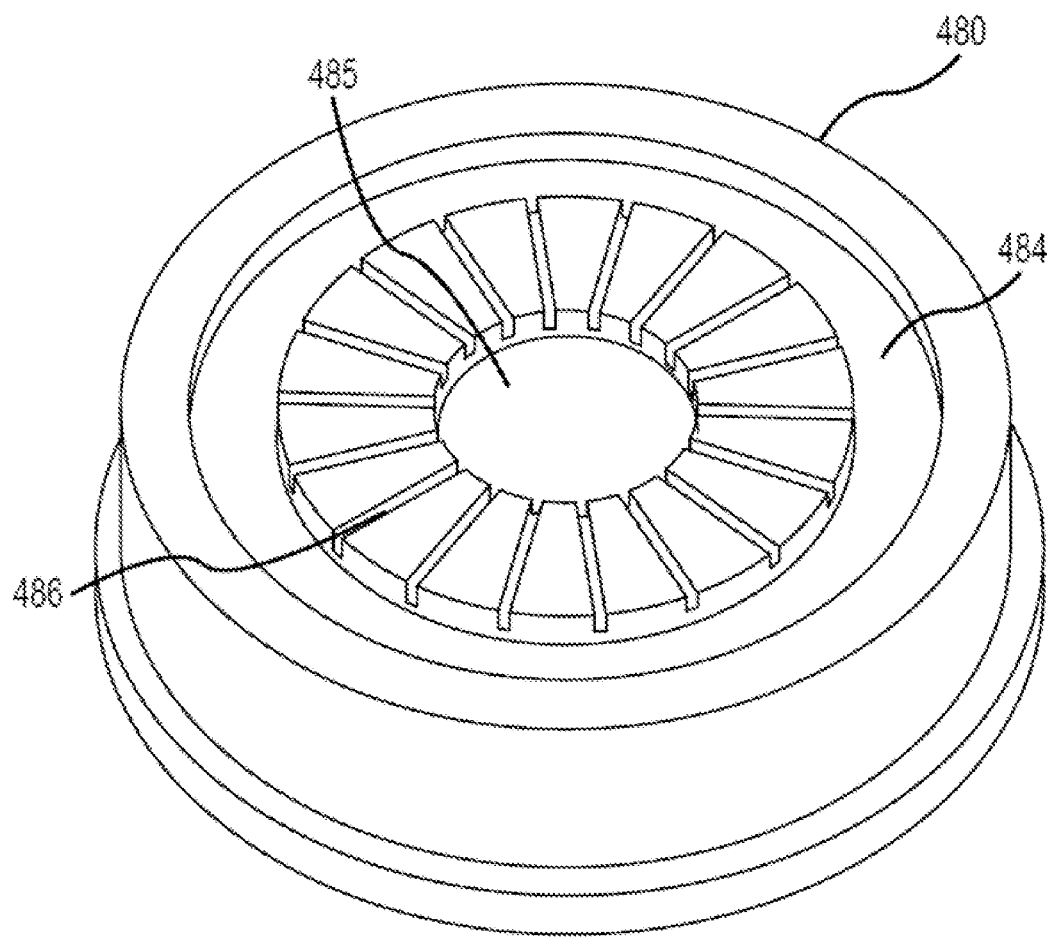
FIG. 6 shows a schematic isometric view of an exemplary spacer according to some embodiments of the present technology.

FIG. 6 is a schematic isometric view of the spacer 480, which may be formed from a ceramic material in some embodiments. The spacer 480 may define at least one fluid inlet 484 that may be fluidly coupled with the gas outlets 424 of the output manifold 420. The fluid inlet 484 may be disposed radially outward of the tapered channel 485 and may direct gas flow from the output manifold 420 into the tapered lumen 485. For example, the fluid inlet 484 may include a channel, such as an annular channel, that directs gas flow inward to the tapered lumen 485 via one or more channels 486 defined by the spacer 480. For example, channels 486 may include radially arranged channels that extend between and fluidly couple the fluid inlet 484 with a top end of the tapered lumen 485. In addition to directing gas into the tapered lumen 485, the channels 486 may divide the gas flow from the fluid inlet 484 into a greater number of fluid paths, which may more evenly distribute the gas within the expansion volume formed by the tapered inner walls of the spacer 480 and gasbox 430. For example, the spacer 480 may include greater than or about 4 radial channels 486, greater than or about 6 radial channels 486, greater than or about 8 radial channels 486, greater than or about 10 radial channels 486, greater than or about 12 radial channels 486, greater than or about 14 radial channels 486, greater than or about 16 radial channels 486, greater than or about 18 radial channels 486, greater than or about 20 radial channels 486, or greater, with greater numbers of channels 486 providing more even distribution of gases into the tapered lumen 485.

By providing a tapered expansion volume further from the faceplate 455, better RPS-only cleaning uniformity may be achieved. In particular, the high location of the expansion volume enables cleaning plasma/gas to be more evenly distributed to the outer periphery of the faceplate 455 and adjacent areas (such as the edge of the pedestal and/or the pumping liner). The increased distribution of the cleaning gases/plasma may also help prevent arcing from occurring during certain deposition procedures, such as those that utilize conductive elements such as carbon and prevent secondary fall-on defects during the deposition cycle. Additionally, such a spacer/gasbox design may help more evenly distribute deposition gases through the faceplate 455 to generate a more uniform film on wafer.

Figure 7:
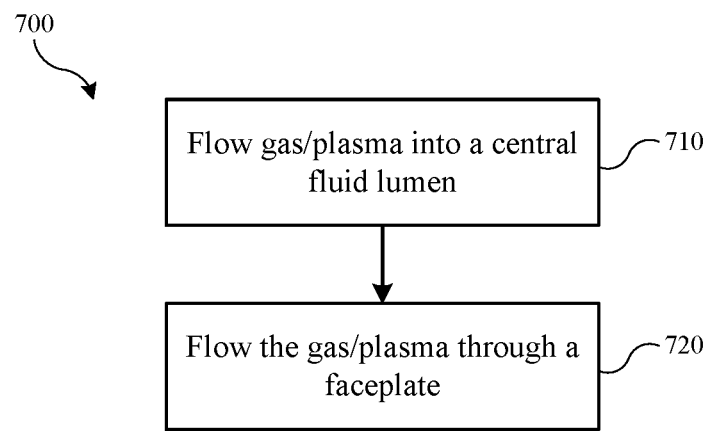
FIG. 7 is a flowchart of an exemplary method of distributing gas to a faceplate according to some embodiments of the present technology.

FIG. 7 illustrates a method 700 of distributing gas to a faceplate according to embodiments of the present technology. Method 700 may include flowing a gas and/or plasma into a central fluid lumen of a gasbox from at least one outlet of an output manifold at operation 710. The gas and/or plasma may be introduced to the output manifold via a RPS unit. For example, cleaning plasma may be flowed directly from a plasma outlet of the RPS unit into the central fluid lumen without passing through any recursive flow path. Cleaning plasma injected directly from the primary outlet of the RPS unit to the central fluid lumen may expand radially outward within an expansion volume defined, at least in part, by the central fluid lumen. Process gas may flow directly into the central fluid lumen and/or may be flowed into the central fluid lumen via a recursive flow path that extends between an inlet and outlet of the output manifold. Once reaching the central fluid lumen, the process gas may expand outward within the expansion volume defined, at least in part, by a central fluid lumen of the gasbox. In other embodiments, the gas may flow into the central fluid lumen via a spacer positioned between the output manifold and the gas box. The spacer may split the flow of gas from the output manifold into a greater number of fluid channels which direct the gas into a tapered lumen of the spacer that is fluidly coupled with the central fluid lumen of the gasbox. The tapered lumen may further define the expansion volume. The central fluid lumen and/or the tapered lumen may include inner walls that taper outward from an inlet side to an outlet side of the respective component to provide the expansion volume.

At operation 720, the gas may be flowed through a plurality of apertures defined within a faceplate disposed beneath the gasbox. The gas may include precursors, plasma effluents, and/or other process gases that may be flowed as part of a deposition and/or other wafer processing application and/or may include a cleaning gas that is flowed to remove film and/or other residual deposition on chamber components, such as the faceplate. By flowing the gas into the expansion volume defined at least in part by an interior of the spacer and/or gasbox, the gas may be more evenly distributed across the apertures of the faceplate, which may result in better film uniformity on wafer and/or better cleaning of the faceplate, especially at peripheral region of the faceplate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
an output manifold that defines at least one gas outlet, wherein the output manifold defines a recursive flow path that fluidly couples one or more gas inlets with the at least one gas outlet, and a number of the at least one gas outlet is greater than a number of the one or more gas inlets;
a gasbox disposed beneath the output manifold, the gasbox comprising an inlet side facing the output manifold and an outlet side opposite the inlet side, the gasbox comprising an inner wall that defines a central fluid lumen, wherein the inner wall tapers outward from the inlet side to the outlet side;
a spacer disposed between the output manifold and the gasbox, wherein:
the spacer defines at least one inlet that is fluidly coupled with the at least one gas outlet; and
an inner wall of the spacer defines a tapered lumen that is fluidly coupled between the at least one inlet and the central fluid lumen of the gasbox, the tapered lumen tapering outward in a direction of the inlet side of the gasbox;
an annular spacer disposed below the gasbox; and
a faceplate disposed beneath the annular spacer, the faceplate defining a plurality of apertures extending through a thickness of the faceplate.

2. The semiconductor processing system of claim 1, wherein:
the at least one gas outlet is disposed radially outward of a top end of the tapered lumen.

3. The semiconductor processing system of claim 1, further comprising:
a tapered insert disposed within the annular spacer, the tapered insert tapering outward from the outlet side of the gasbox to a radial position that is beyond the plurality of apertures.

4. The semiconductor processing system of claim 1, wherein:
the output manifold defines a central aperture therethrough; and
each of the at least one gas outlet is disposed radially outward of the central aperture.

5. The semiconductor processing system of claim 4, further comprising:
a remote plasma source unit having an outlet that is fluidly coupled with the central aperture.

6. The semiconductor processing system of claim 1, wherein:
the spacer defines a plurality of channels that extend between the at least one inlet and the tapered lumen that expand a flow path from the at least one inlet into a greater number of fluid paths.

7. The semiconductor processing system of claim 6, wherein:
the at least one inlet comprises an annular recess; and
the plurality of channels comprise radially arranged channels that extend inward from the annular recess to the tapered lumen.

8. The semiconductor processing system of claim 1, wherein:
a taper of the tapered lumen matches the taper of the central fluid lumen at an interface of the spacer and the gasbox.

9. The semiconductor processing system of claim 1, wherein:
an inner diameter of the annular spacer is positioned radially outward of the plurality of apertures.

10. The semiconductor processing system of claim 1, further comprising:
a degree of taper of the inner wall of the central fluid lumen varies along a length of the central fluid lumen.

11. The semiconductor processing system of claim 10, wherein:
a top section of the central fluid lumen has steeper degree of taper than a lower section of the central fluid lumen.

12. The semiconductor processing system of claim 1, wherein:
a degree of taper of the inner wall of the central fluid lumen is constant along a length of the central fluid lumen.

13. The semiconductor processing system of claim 1, wherein:
a bottom end of the inner wall of the gasbox has a diameter that at least substantially matches a diameter of a top end of the inner wall of the spacer.

14. The semiconductor processing system of claim 1, wherein:
an inner diameter of the annular spacer is greater than a largest inner diameter of the central fluid lumen.

15. The semiconductor processing system of claim 1, wherein:
a degree of taper of the inner wall of the central fluid lumen is at least 45° relative to vertical.

16. The semiconductor processing system of claim 1, wherein:
one or both of the tapered lumen and the central fluid lumen taper outward in a linear fashion.

17. The semiconductor processing system of claim 1, wherein:
the inlet side of the gasbox defines an annular channel;
the annular channel is accessed via an inlet aperture; and
the gasbox defines one or more outlet apertures that extend from the annular channel and through the outlet side of the gasbox.

18. The semiconductor processing system of claim 17, wherein:
the inlet aperture extends through the inlet side of the gasbox.

19. The semiconductor processing system of claim 1, wherein:
the gasbox defines a cooling channel.

* * * * *